(12) United States Patent
Segallis et al.

(10) Patent No.: US 6,417,730 B1
(45) Date of Patent: Jul. 9, 2002

(54) AUTOMATIC GAIN CONTROL SYSTEM AND RELATED METHOD

(75) Inventors: Greg P. Segallis; Gary L. Bastin, both of Palm Bay; Dennis A. Green, Vero Beach; David S. Albert, Melbourne; Robert L. Johnson, Palm Bay; Frank R. Brueggeman, Orlando, all of FL (US)

(73) Assignee: Harris Corporation, Melbourne, FL (US)

( * ) Notice: Subject to any disclaimer, the term of this patent is extended or adjusted under 35 U.S.C. 154(b) by 31 days.

(21) Appl. No.: 09/727,301

(22) Filed: Nov. 29, 2000

(51) Int. Cl.$^7$ ................................................ H03G 3/20
(52) U.S. Cl. ...................... 330/129; 330/279; 455/239.1
(58) Field of Search ................................. 330/129, 279; 455/239.1

(56) References Cited

U.S. PATENT DOCUMENTS

| 3,931,584 A | 1/1976 | Motley et al. ............... 330/129 |
| 4,301,445 A | 11/1981 | Robinson ............... 340/825.54 |
| 4,463,722 A | 8/1984 | Kobayashi .................. 123/425 |
| 4,553,104 A | 11/1985 | Olsen ........................ 330/129 |
| 4,750,058 A | 6/1988 | Hirt et al. .................... 360/46 |
| 4,989,074 A | 1/1991 | Matsumoto .................. 358/21 |
| 5,107,140 A | 4/1992 | Sherman .................... 307/358 |
| 5,168,148 A | 12/1992 | Giebel ........................ 235/462 |
| 5,297,184 A | 3/1994 | Behrens et al. ............... 375/98 |
| 5,315,268 A | 5/1994 | Botti et al. .................. 330/298 |
| 5,404,115 A | 4/1995 | Johnson ..................... 330/279 |
| 5,416,441 A | * 5/1995 | Nagano ...................... 330/129 |
| 5,530,922 A | * 6/1996 | Nagode ...................... 455/126 |
| 5,724,003 A | 3/1998 | Jensen et al. ................ 330/129 |
| 5,732,334 A | * 3/1998 | Miyake ...................... 455/126 |
| 5,809,408 A | 9/1998 | Fujimoto et al. ........ 455/234.2 |
| 5,870,154 A | 2/1999 | Conover et al. ............. 348/673 |
| 5,907,261 A | 5/1999 | Jones ......................... 330/254 |
| 6,073,848 A | * 6/2000 | Giebel .................... 235/462.26 |

* cited by examiner

Primary Examiner—Robert Pascal
Assistant Examiner—Henry Choe
(74) Attorney, Agent, or Firm—Allen, Dyer, Doppelt, Milbrath & Gilchrist, P.A.

(57) ABSTRACT

An automatic gain control (AGC) system includes at least one variable-gain component having a controllable gain over a gain control range and a sensor for sensing an amplitude of a signal from the at least one variable-gain control component. The sensor may have an operating window based upon the signal that is smaller than the gain control range of the at least one variable-gain component. The AGC system may also include a controller responsive to the sensor for controlling the at least one variable-gain component according to coarse and fine gain values to set the amplitude of the signal within the operating window of the sensor. The controller may implement at least one coarse gain jump from a current coarse gain value to a new coarse gain value when the sensor indicates the amplitude is outside the operating window. The controller may further implement movement to a fine gain value when the sensor indicates the amplitude is in the operating window.

25 Claims, 5 Drawing Sheets

AUTOMATIC GAIN CONTROL SYSTEM AND RELATED METHOD

FIELD OF THE INVENTION

The present invention relates to electronic circuits, and, more particularly, to gain control circuits.

BACKGROUND OF THE INVENTION

Automatic gain control (AGC) circuits are well known and are commonly used for varying the gain of an input signal to provide an output signal having a substantially constant power level. Such circuits may be used in a wide variety of applications, such as radio receivers, bar code readers, audio volume control systems, and the like. In a typical AGC circuit, a variable gain component, such as an amplifier, receives the input signal and produces an output signal. A difference between an amplitude of the output signal and reference value is determined. This difference is integrated and fed back to the variable gain component to adjust the gain of the input signal to maintain the amplitude of the output signal within a predetermined operating window.

An AGC circuit therefore allows an input signal to be adjusted before it is further processed. This is generally necessary because the processing equipment used to recover information from the incoming input signal may work better with a fixed-amplitude signal. Even so, because source signals can vary widely, it may be difficult for an AGC circuit to adjust the gain of the input signal quickly enough (i.e., to converge) to prevent processing errors in certain applications.

One example of an AGC circuit is disclosed in U.S. Pat. No. 4,301,445 to Robinson entitled "Communication System and Method Having Wide Dynamic Range Digital Gain Control." The AGC circuit applies an input data signal from a logic attenuator to a switchable integrator. The integrator is charged and discharged to periodically develop a voltage signal proportional in magnitude to the amplitude of the data signal from the digital logic attenuator. The magnitude of the voltage signal from the integrator is compared to a voltage reference. A control signal is generated when the voltage signal and voltage reference do not compare, and binary state signals are continuously applied to the digital logic attenuator to effect a change in the amount of attenuation by the digital logic attenuator. The states of the binary state signals are changed during the presence of the control signal and at a time no later than the discharging of the integrator to maintain the magnitude of the data signal at the output of the logic attenuator substantially constant. The stated goals of the patent are to provide a wide dynamic range AGC circuit that is inherently linear and prevents the introduction of inter-modulation and distortion into elements of a system.

Another AGC circuit is disclosed in U.S. Pat. No. 3,931,584 to Motley et al. entitled "Automatic Gain Control." This AGC includes an analog-to-digital (A/D) converter for sampling an output analog signal from a gain stage including coarse and fine gain controls that provides the amplitude of the samples in digital words characterized by bits including the Most Significant Bit (MSB). The AGC circuit is responsive to the digital characteristics of at least the MSB of the digital words and causes the gain stage to amplify the output analog signal to a substantially constant power level. A stated goal of the patent is to allow amplification of the input signal to a level approaching a maximum level expressible by the digital words and to reduce quantization of noise of the converter by maximizing the number of digital words which are available to express the signal amplitude.

While prior art AGC circuits such as those described above provide certain advantages, there still remain certain applications in which these circuits do not provide adequate response time to input signals with widely varying amplitudes, which may in turn lead to processing errors.

SUMMARY OF THE INVENTION

In view of the foregoing background, it is therefore an object of the invention to provide an automatic gain control system and related method that provides improved response times for input signals with widely varying amplitudes.

This and other objects, features, and advantages in accordance with the present invention are provided by an automatic gain control (AGC) system including at least one variable-gain component having a controllable gain over a gain control range, a sensor for sensing an amplitude of a signal from the at least one variable-gain control component and a controller for setting the variable gain component according to coarse and fine gain values. More particularly, the sensor may have an operating window that is smaller than the gain control range of the at least one variable-gain component. The controller may be responsive to the sensor for controlling the at least one variable-gain component according to coarse and fine gain values to set the amplitude of the signal within the operating window of the sensor. The controller may implement at least one coarse gain jump from a current coarse gain value to a new coarse gain value when the sensor indicates the amplitude is outside the operating window. In addition, the controller may further implement movement to a fine gain value when the sensor indicates the amplitude is in the operating window.

The controller may set coarse and fine gain values to substantially center the amplitude of the signal from the at least one variable-gain control component within the operating window of the sensor. Furthermore, a size of the at least one coarse gain jump from the current coarse gain value to the new coarse gain value may be based upon the prior coarse gain value. Each coarse gain jump may be half-way between the current coarse gain value and either a previous lower coarse gain value or a lowest coarse gain value when the sensor indicates the amplitude is at or below a low end of the operating window and half-way between the current coarse gain value and either a previous higher coarse gain value or a highest coarse gain value when the sensor indicates the amplitude is at or above a high end of the operating window, for example. A direction for each jump may be downward when the sensor indicates the amplitude is at a lower end of the gain control range, and upward when the sensor indicates the amplitude is at a higher end of the gain control range. Also, a range of fine gain values may extend at least over a range of spacing between adjacent coarse gain values.

The controller may include a digital processing circuit for generating at least one control signal for the at least one variable-gain component. The digital processing circuit may include an analog-to-digital (A/D) converter for converting an output from the sensor to a digital value, a digital control loop connected to the A/D converter, and an output section for generating at least one control signal for the at least one variable-gain component based upon the digital control loop. Additionally, the at least one variable-gain component may include at least one first variable-gain component having an increasing gain for an increasing control signal and at least one second variable-gain component connected in series with the at least one first variable-gain component and having a decreasing gain for an increasing control signal. The output section of the digital processing circuit may include a digital-to-analog converter.

A method for controlling a signal gain according to the present invention is also provided and may include sensing an amplitude of a signal from at least one variable-gain component having a controllable gain over a gain control range and controlling the gain of the at least one variable-gain component responsive to the sensed amplitude and according to coarse and fine gain values. The controller sets the amplitude within an operating window smaller than the gain control range of the at least one variable-gain component by implementing at least one coarse gain jump from a current coarse gain value to a new coarse gain value when the amplitude is outside the operating window, and implementing movement to a fine gain value when the amplitude is in the operating window.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
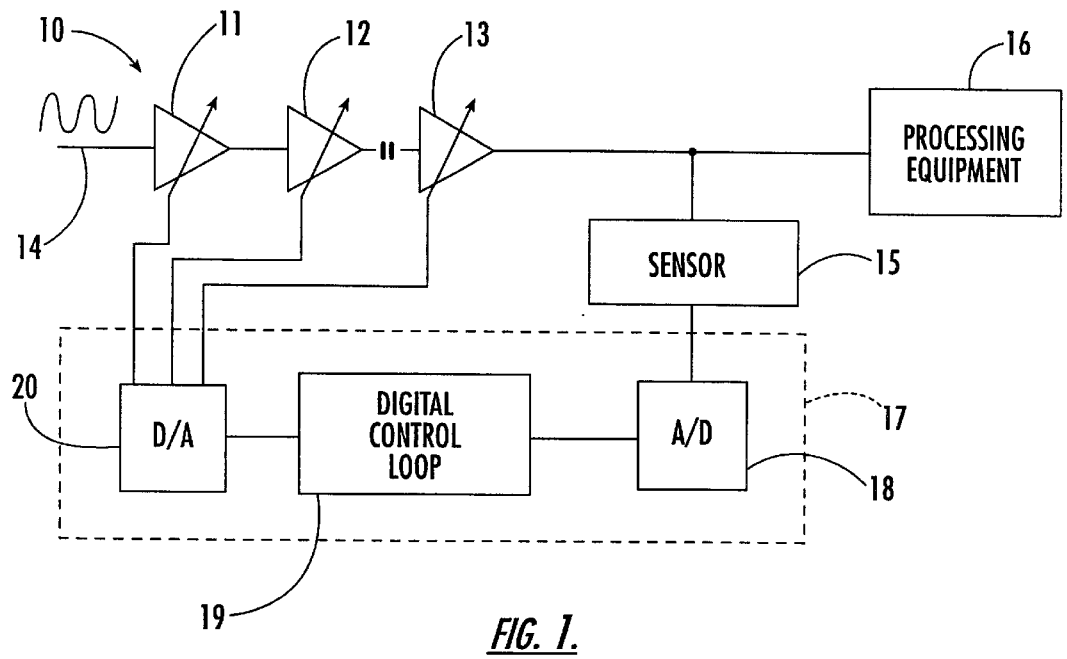
FIG. 1 is a schematic block diagram of an automatic gain control (AGC) system according to the present invention.

Referring now to the schematic diagram of FIG. 1, an automatic gain control (AGC) system 10 according to one aspect of the invention is first described. The AGC system 10 includes variable-gain components 11, 12, 13 connected in series and providing a controllable gain over a gain control range. The variable-gain components 11, 12, 13, may be variable-gain amplifiers, for example, which are well known in the art. The variable-gain component 11 receives at an input 14 thereof a variable-amplitude source signal. A sensor 15 senses an amplitude of the signal from the component 13 to be processed by processing equipment 16. The sensor 15 has an operating window 25 (see FIG. 2) that is smaller than the gain control range of the variable-gain components 11, 12, 13.

A controller 17 controls the variable-gain components 11, 12, 13 responsive to the sensor 15. The controller 17 may be a digital processing circuit, for example, generating respective control signals for controlling the variable-gain components 11, 12, 13. That is, the controller 17 may include an analog-to-digital (A/D) converter 18 for converting an output from the sensor 15 to a digital value, a digital control loop 19 connected to the A/D converter, and an output section 20 for generating the control signals for the variable-gain components 11, 12, 13 based upon the digital control loop. The output section 20 may be a digital-to-analog (D/A) converter and the digital control loop may be implemented with a microprocessor, for example.

The controller 17 controls the variable-gain components 11, 12, 13 according to coarse and fine gain values to set the amplitude of the signal within the operating window 25 of the sensor. The controller 17 implements at least one coarse gain jump from a current coarse gain value to a new coarse gain value when the sensor 15 indicates the amplitude is outside the operating window 25. The controller 17 further implements movement to a fine gain value when the sensor 15 indicates the amplitude is in the operating window 25. Furthermore, the controller 17 preferably sets coarse and fine gain values to substantially center the amplitude of the signal from the variable-gain control component 13 within the operating window 25 of the sensor 15. Of course, those of skill in the art will appreciate that the amplitude need not be centered within the operating window 25 and that other alignments are possible.

A size of the at least one coarse gain jump from the current coarse gain value to the new coarse gain value may be based upon the prior coarse gain value. Each jump may be half-way between the current coarse gain value and either a previous lower coarse gain value or a lowest coarse gain value, for example, when the sensor indicates the amplitude is at or below a low end of the operating window 25. Similarly, each coarse gain jump may be half-way between the current coarse gain value and either a previous higher coarse gain value or a highest coarse gain value when the sensor 15 indicates the amplitude is at or above a high end of the operating window 25. A direction for each coarse gain jump is downward when the sensor 15 indicates the amplitude is at a lower end of the gain control range, and upward when the sensor indicates the amplitude is at a higher end of the gain control range.

Figure 2:
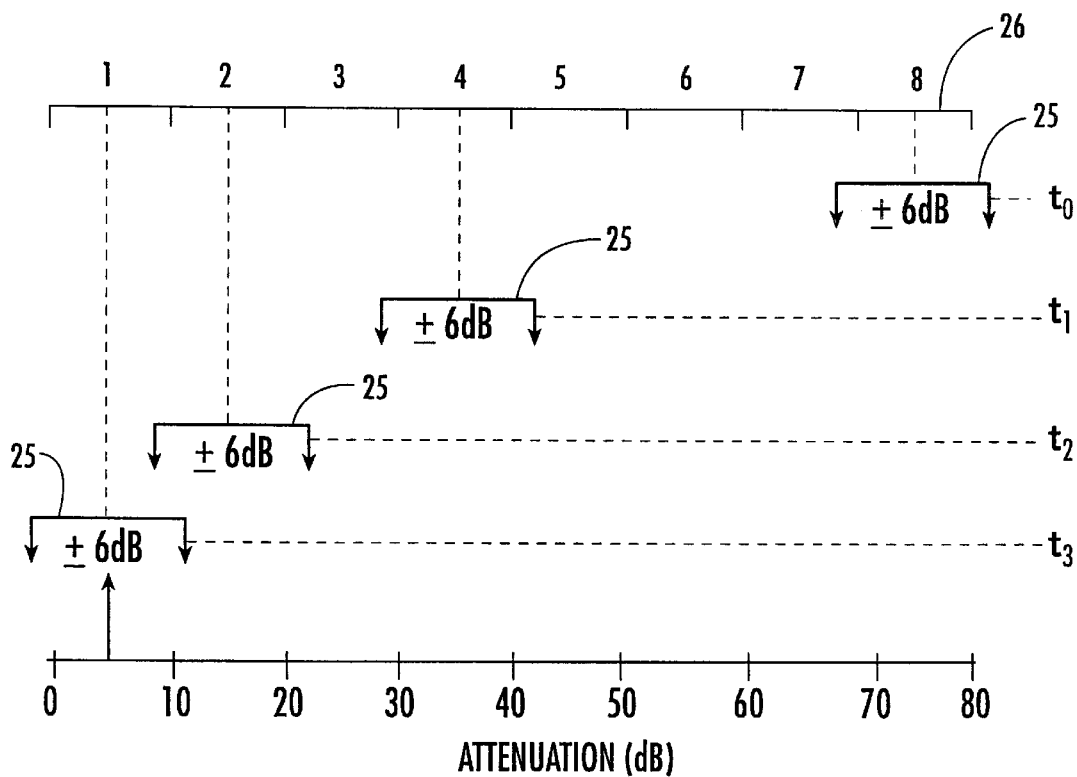
FIG. 2 is a diagram illustrating a series of coarse gain adjustments as may be performed by the AGC system as shown in FIG. 1.

The coarse gain control according to the present invention will be more readily understood upon examination of the example illustrated in FIG. 2. For this example, it will be assumed that the sensor 15 has an operating window 25 of 12 dB, i.e., ±6 dB above and below the value at which the operating window is centered. Furthermore, the gain control range for the variable gain components 11, 12, 13 is assumed to extend from 0 to 80 dB. A scale 26 illustratively depicts eight coarse gain values each corresponding to a 10 dB portion of the gain control range (e.g., a gain control value 1 corresponds to 0–10 dB, a gain control value 2 corresponds to 10–20 dB, etc.).

At a starting time $t_0$, the operating window 25 of the sensor 15 is centered at 75 dB, whereas a gain of the signal from the variable-gain component 13 at a time $t_0$ is 3 dB. The sensor 15 will therefore indicate that the amplitude is outside the operating window 25 (i.e., the sensor is "saturated") at the lower end of the gain control range (i.e., toward the 0 dB end). Accordingly, the controller 17 will implement a coarse gain jump in the downward direction (i.e., toward 0 dB) half-way between the current coarse gain value and a lowest coarse gain value. In this case, the lowest coarse gain value is 1, so one-half the distance between the values 1 and 8 would be 4.5. In the present embodiment, only integer coarse gain numbers are used, so the digital control loop will round to the integer corresponding to the longer of the two possible coarse gain jumps. As a result, the operating window will jump to be centered at 4 dB at a time $t_1$. Those of skill in the art will appreciate that intermediate values may also be used so that the jumps may always be exactly half-way between the current coarse gain value and the new coarse gain value, and also that jumps of varying size may be used.

After the operating window 25 has jumped to the coarse gain value 4 at the time $t_1$, the sensor 15 will thereafter indicate that the amplitude is outside the operating window 25 at the lower end of the gain control range. The controller 17 will therefore cause the operating window 25 to jump to a coarse gain value of 2 at a time $t_2$. Once again, the sensor 15 will thereafter indicate that the amplitude is outside the operating window 25 at the lower end of the gain control range and a jump to the lowest coarse gain value (i.e., 1) will be implemented at a time $t_3$. Once the operating window 25 corresponds to the coarse gain value of 1, the amplitude of the signal (3 dB) will then correspond with the operating window.

Those of skill in the art will appreciate that the lowest or highest coarse gain value will not always be the lowest or highest value on the scale 26. For instance, if the operating window 25 was centered at the coarse gain value 7 at $t_0$ and the signal amplitude corresponded to 53 dB instead of 3 dB, the first jump would still have been to the coarse gain value 4. However, the second jump at time $t_2$ would have been to a coarse gain value of 6, with 7 being used as the highest coarse gain value to determine the half-way point since 7 was the previous higher value. It will also be appreciated that for the above described coarse gain adjustment and a gain control range of 80 dB, no more than 3 coarse gain jumps will be required to place the amplitude of any signal within the operating window 25 from any given starting value. As a result, the time required to bring the sensor out of saturation is significantly reduced over prior art devices.

The sensor 15 will indicate that the amplitude is in the operating window 25 after the coarse gain jump to the coarse gain value 1. The controller 17 will then implement movement to a fine gain value to center the operating window 25 on the signal. A range of fine gain values extends at least over a range of spacing between adjacent coarse values. The fine gain value will be set by the controller 17 based upon an error signal between the measured amplitude from the sensor 15 and a desired amplitude. The error signal may be determined using a proportional constant filter or a frequency dependent filter, for example, which are known to those of skill in the art.

Figure 3:
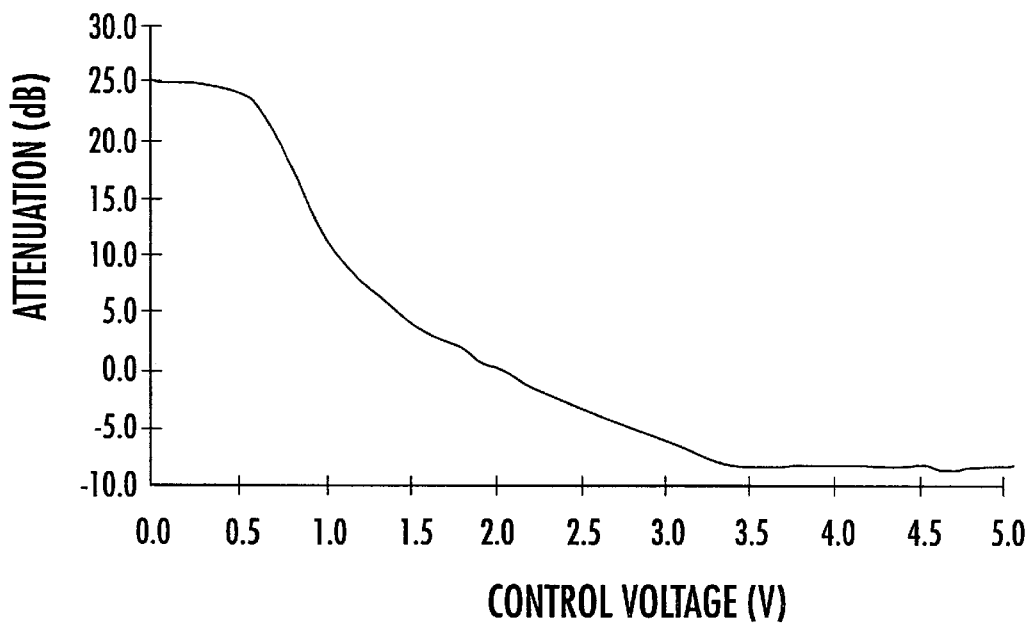
FIG. 3 is a graph of attenuation versus control voltage for a first variable-gain component of the AGC system of FIG. 1.
Figure 4:
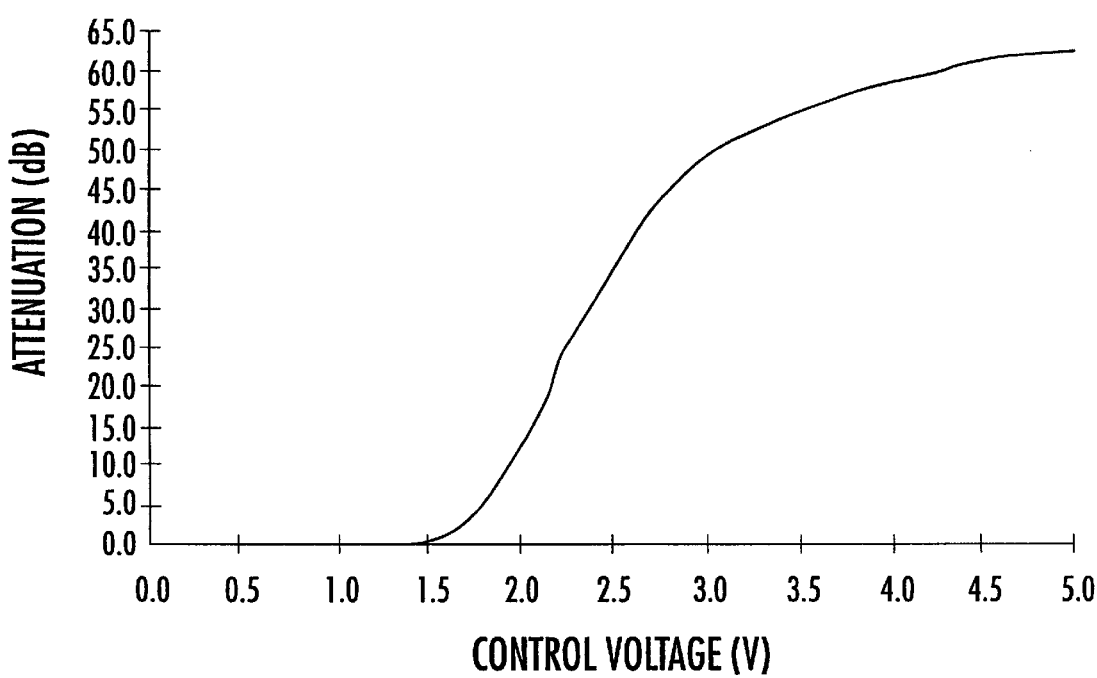
FIG. 4 is a graph of attenuation versus voltage for second and third variable-gain components of the AGC system of FIG. 1.

The variable-gain component 11 may possibly have an increasing gain for an increasing control signal. The graph shown in FIG. 3 illustrates an exemplary attenuation by the variable-gain component 11 over a range of control voltages from 0 to 5 V. Conversely, the variable-gain components 12, 13 may possibly have a decreasing gain for an increasing control signal. The variable-gain components 12, 13 may also be identical to one another but different that the variable-gain component 11. The graph shown in FIG. 4 similarly illustrates an exemplary attenuation by the variable-gain components 12, 13 over a range of control voltages from 0 to 5 V.

Figure 5:
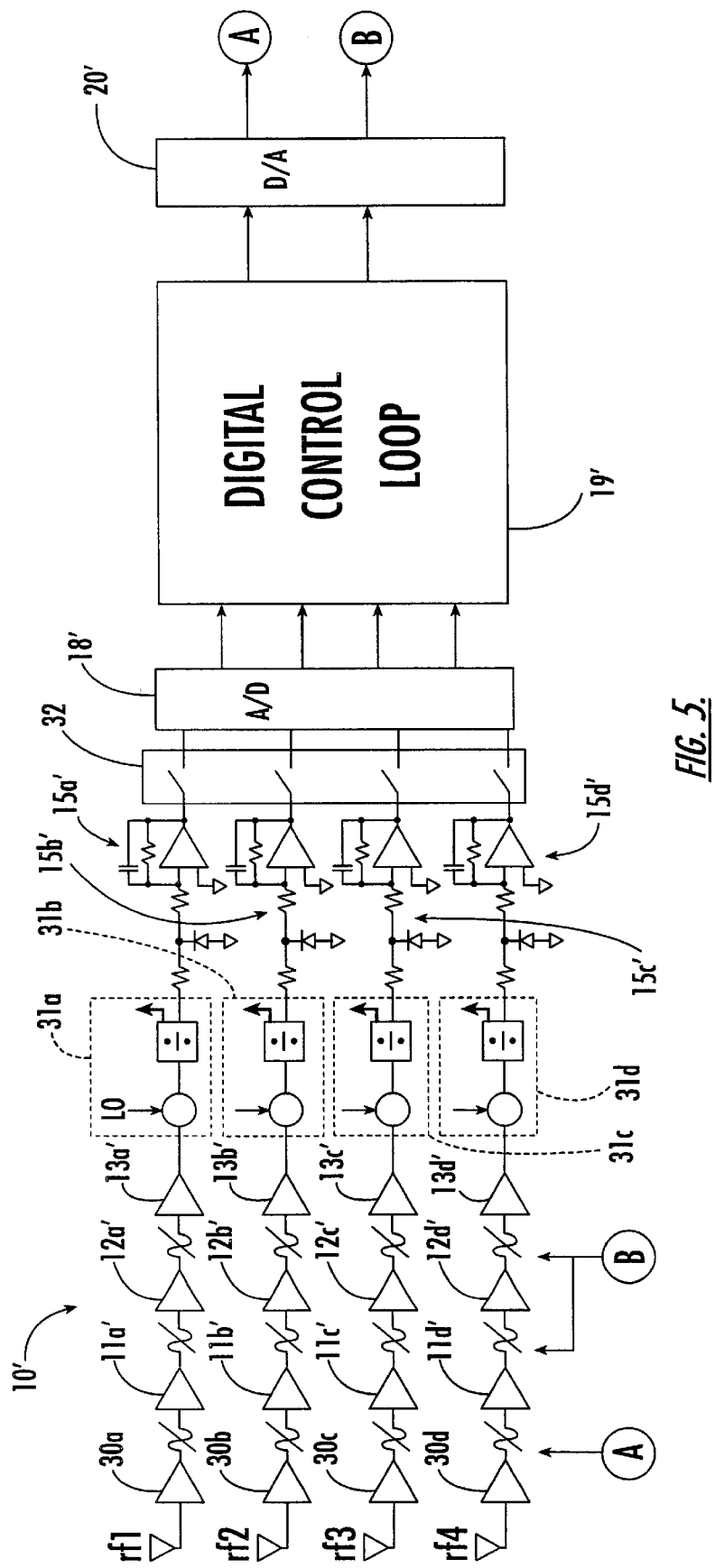
FIG. 5 is a schematic circuit diagram of an alternate embodiment of an AGC system according to the present invention.

Referring now additionally to the detailed schematic diagram of FIG. 5, another embodiment of an AGC system 10' according to the present invention will now be described. As can be seen, the AGC system 10' acts upon four signal pathways corresponding to source signals rf1, rf2, rf3, and rf4 all at the same time to utilize the aggregate of these signals and minimize effects of pathway variations, as will be appreciated by those of skill in the art. Of course, it will also be appreciated that the present invention is not limited to any particular number of signal pathways and that more or fewer signal pathways may be used. The signals rf1, rf2, rf3, and rf4 are received by respective buffers 30a, 30b, 30c, and 30d.

The buffers 30a, 30b, 30c, and 30d are connected to respective variable-gain components 11a'–11d', 12a'–12d', and 13a'–13d', which operate as described above. The signals rf1, rf2, rf3, and rf4 may then be passed through respective demodulation stages 31a, 31b, 31c, and 31d, each of which may include a local oscillator and a divider circuit as shown. Respective sensors 15a'–15d', which may include a diode connected to a filtering amplifier, for example, receive the signals rf1, rf2, rf3, and rf4 from the demodulation stages 31a–31d, which are then multiplexed by a multiplexer 32 and input into the A/D converter 18'.

Figure 6:
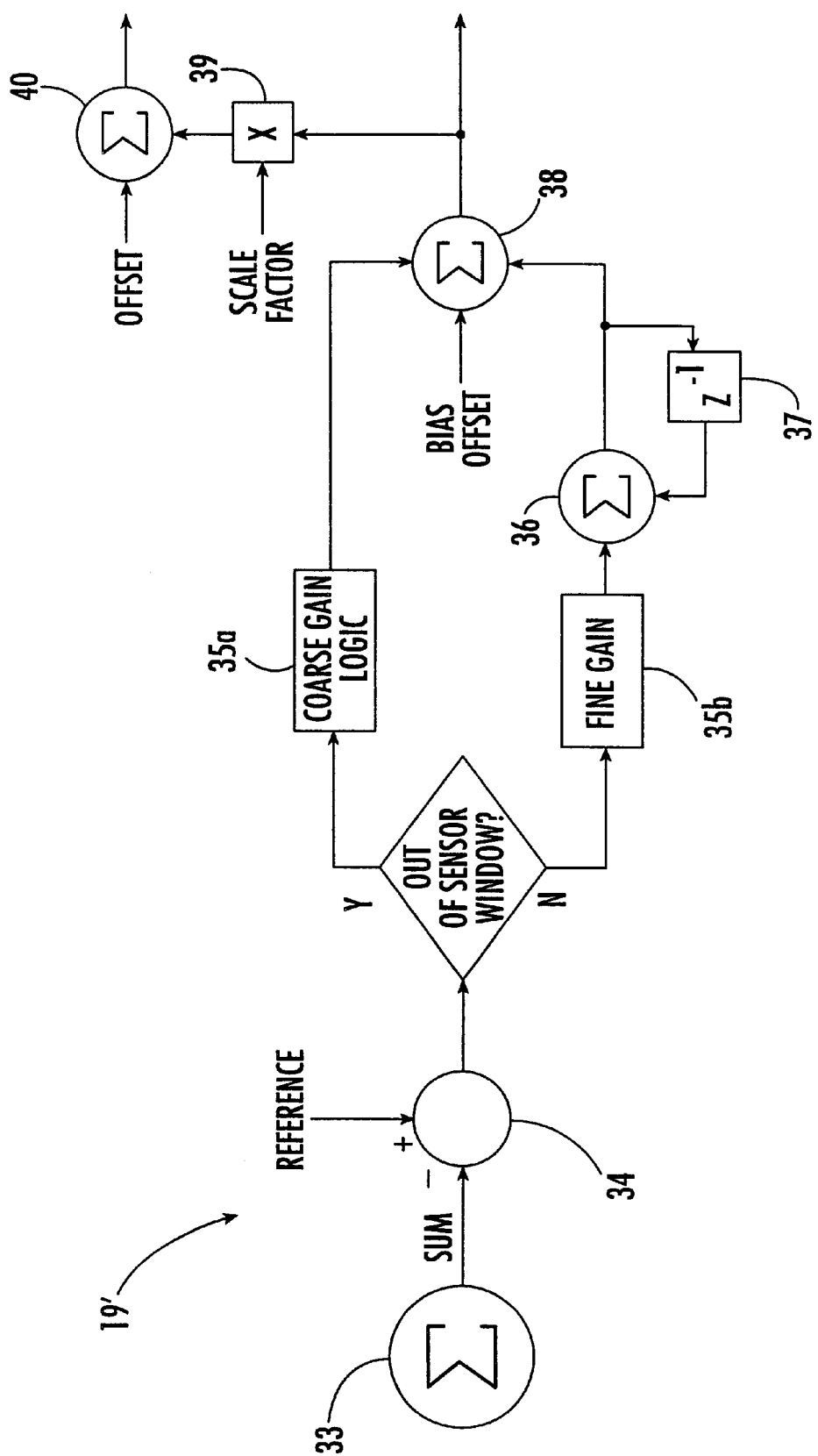
FIG. 6 is a schematic circuit diagram of the digital control loop of FIG. 5.

The digital control loop 19' performs the above-described coarse and fine gain control functions and may be implemented using software, for example. A more detailed implementation of the AGC system 10 and the digital control loop 19' is shown schematically in FIGS. 5 and 6. The digital control loop 19' includes a summation circuit 33 for summing the digital output signals from the A/D converter 18' corresponding to the input signals rf1–rf4. A comparator 34 compares the sum with a reference value, which corresponds to the sum when the operating window is centered on the signal. If the signal is out of the operating window, coarse gain logic 35a generates a new gain. If the signal is within the operating window, the output of the comparator is used by the fine gain 35b to generate a new gain change. In this case a sum 36 and delay 37 act to accumulate the gain changes to store the new net gain. A summation circuit 38 adds an offset if needed. The result either is sent directly to the D/A converter 20' to signal B or is scaled by a circuit 39, offset by a summation circuit 40, and sent to the D/A converter to signal A. The resulting control signals are input into the D/A converter 20' and respective output signals from the D/A converter adjust the variable-gain control elements 11'–13' as described above and as illustratively shown with symbols A and B.

Figure 7:
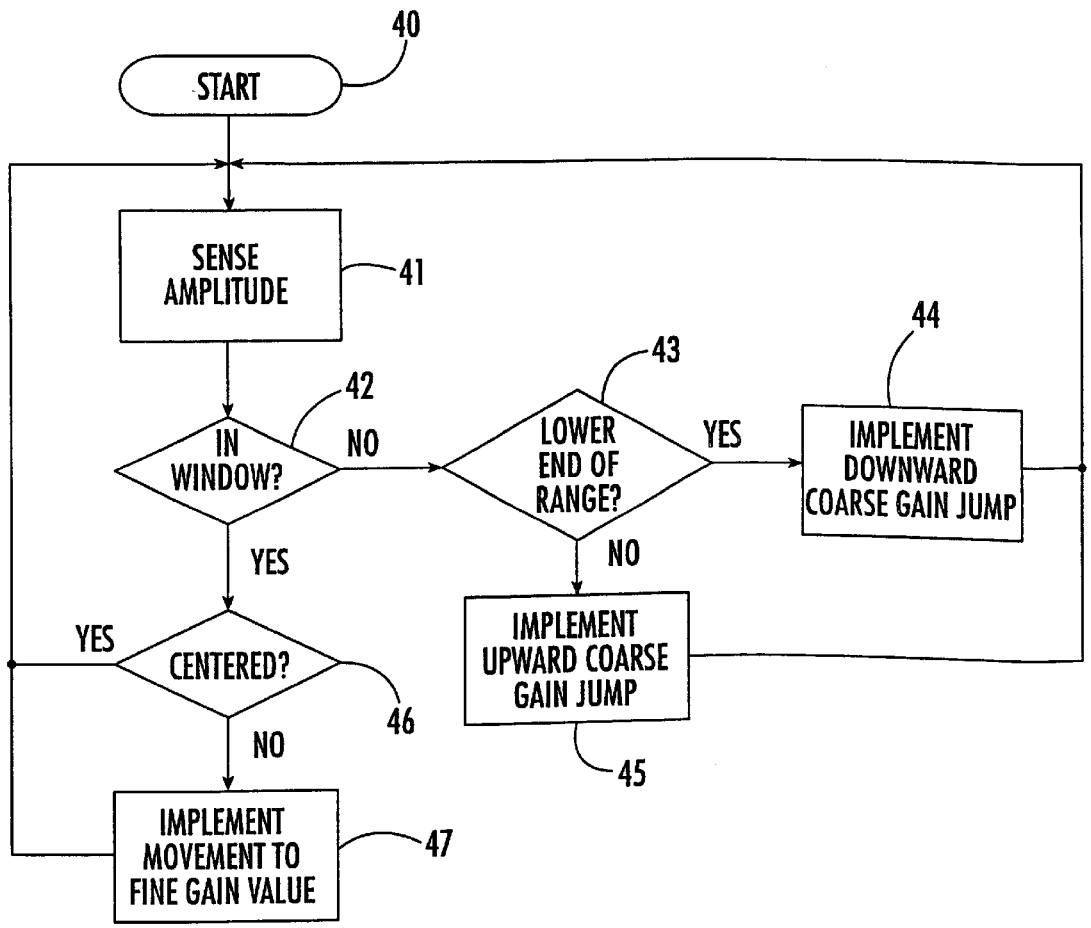
FIG. 7 is a flow diagram illustrating a method for controlling a signal gain according to the present invention.

A method for controlling a signal gain according to the present invention will now be described with reference to the flow diagram of FIG. 7 and with reference to FIG. 1. The method begins (Block 40) with the sensor 15 sensing the amplitude of the signal from the variable-gain components 11–13 (Block 41), which have a controllable gain over a gain control range. The controller 17 then determines whether the amplitude of the signal is within the operating window 25, as seen at Block 42. If not, a coarse gain jump will be performed and the controller 17 determines whether the amplitude is at the lower end of the gain control range, as seen at Block 43. If the sensor indicates the signal amplitude is at the low end of the gain control range, the direction of the jump will be downward, as shown at Block 44. Conversely, when the sensor 15 indicates the signal amplitude is at the higher end of the gain control range, the direction of the jump will be upward, as shown at Block 45. As noted above, the size of the coarse gain jump from the current coarse gain value to the new coarse gain value may be based upon the prior coarse gain value, and the coarse gain jump may be half-way between the current coarse gain value and a previous, lowest, or highest coarse gain value, as the case may be.

With each iteration the controller 17 continues to determine whether the signal amplitude is within the operating window 25 (Block 42). Once it has been determined that the signal amplitude is within the operating range, the controller 17 implements the fine gain adjustment. As noted above, the coarse and fine gain values may be set to substantially center the amplitude of the signal from the at least one variable-gain control component within the operating window 25. Thus, if the controller 17 determines that the signal is not centered (Block 46) it implements movement to a fine gain value, as seen at Block 47. Again, the range of fine gain values preferably extends at least over a range of spacing between adjacent coarse gain values. Once the amplitude is centered within the operating window 25, no further gain control is implemented until the source signal varies to cause a shift in the amplitude.

Those of skill in the art will therefore appreciate that the AGC system and related method according to the present invention provide several advantages. For example, the AGC system compensates for sensors of limited range and thereby allows less expensive sensors to be used. The invention only requires relatively simple, fixed-point calculations which allow for less expensive microcontrollers to be used as well. Furthermore, the invention provides for faster convergence times than prior art devices, and the overall system is exposed to less non-normalized amplitudes, which increases performance an reduces potential damage.

The architecture of the AGC also allows complex control algorithms to be implemented and the invention therefore may be used in numerous AGC applications. The architecture additionally allows various types of parts to be used, so the invention may be implemented in more severe environments. Minimal calibration of the components and customization of the software is generally required, resulting in a fast build time. Those of skill in the art will also appreciate that the sensor curves (dB vs. V) and associated variable-gain element curves (V vs. dB) according to the present invention do not have to be linear. That is, they may be limited in range and have saturation points and other non-linearities so long as they are monotonic in gain.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An automatic gain control system comprising:
   at least one variable-gain component having a controllable gain over a gain control range;
   a sensor for sensing an amplitude of a signal from said at least one variable-gain control component, said sensor having an operating window that is smaller than the gain control range of said at least one variable-gain component; and
   a controller responsive to said sensor for controlling said at least one variable-gain component according to coarse and fine gain values to set the amplitude of the signal within the operating window of said sensor, said controller implementing at least one coarse gain jump from a current coarse gain value to a new coarse gain value when said sensor indicates the amplitude is outside the operating window, and said controller further implementing movement to a fine gain value when said sensor indicates the amplitude is in the operating window.

2. The automatic gain control system of claim 1 wherein said controller sets coarse and fine gain values to substantially center the amplitude of the signal from said at least one variable-gain control component within the operating window of said sensor.

3. The automatic gain control system of claim 1 wherein a size of the at least one coarse gain jump from the current coarse gain value to the new coarse gain value is based upon a prior coarse gain value.

4. The automatic gain control system of claim 3 wherein each coarse gain jump is half-way between the current coarse gain value and either a previous lower coarse gain value or a lowest coarse gain value when said sensor indicates the amplitude is at or below a low end of the operating window; and wherein each coarse gain jump is half-way between the current coarse gain value and either a previous higher coarse gain value or a highest coarse gain value when said sensor indicates the amplitude is at or above a high end of the operating window.

5. The automatic gain control system of claim 3 wherein a direction for each coarse gain jump is downward when said sensor indicates the amplitude is at a lower end of the gain control range, and upward when said sensor indicates the amplitude is at a higher end of the gain control range.

6. The automatic gain control system of claim 1 wherein a range of fine gain values extends at least over a range of spacing between adjacent coarse gain values.

7. The automatic gain control system of claim 1 wherein said controller comprises a digital processing circuit for generating at least one control signal for said at least one variable-gain component.

8. The automatic gain control system of claim 7 wherein said digital processing circuit comprises:
   an analog-to-digital (A/D) converter for converting an output from said sensor to a digital value;
   a digital control loop connected to said A/D converter; and
   an output section for generating at least one control signal for said at least one variable-gain component based upon said digital control loop.

9. The automatic gain control system of claim 8 wherein said at least one variable-gain component comprises:
   at least one first variable-gain component having an increasing gain for an increasing control signal; and
   at least one second variable-gain component connected in series with said at least one first variable-gain component and having a decreasing gain for an increasing control signal.

10. The automatic gain control system of claim 8 wherein said output section comprises a digital-to-analog converter.

11. An automatic gain control system comprising:
    at least one variable-gain component having a controllable gain over a gain control range;
    a sensor for sensing an amplitude of a signal from said at least one variable-gain control component, said sensor having an operating window that is smaller than the gain control range of said at least one variable-gain component; and
    a controller responsive to said sensor for controlling said at least one variable-gain component according to coarse and fine gain values to set the amplitude of the signal within the operating window of said sensor, said controller implementing at least one coarse gain jump of a size based upon a prior coarse gain value from a current coarse gain value to a new coarse gain value when said sensor indicates the amplitude is outside the operating window, said controller further implementing movement to a fine gain value when said sensor indicates the amplitude is in the operating window, and said controller also setting coarse and fine gain values to substantially center the amplitude of the signal from said at least one variable-gain control component within the operating window of said sensor.

12. The automatic gain control system of claim 11 wherein each coarse gain jump is half-way between the current coarse gain value and either a previous lower coarse gain value or a lowest coarse gain value when said sensor indicates the amplitude is at or below a low end of the operating window.

13. The automatic gain control system of claim 11 wherein each coarse gain jump is half-way between the current coarse gain value and either a previous higher coarse gain value or a highest coarse gain value when said sensor indicates the amplitude is at or above a high end of the operating window.

14. The automatic gain control system of claim 11 wherein a direction for each coarse gain jump is downward when said sensor indicates the amplitude is at a lower end of the gain control range, and upward when said sensor indicates the amplitude is at a higher end of the gain control range.

15. The automatic gain control system of claim 11 wherein a range of fine gain values extends at least over a range of spacing between adjacent coarse gain values.

16. The automatic gain control system of claim 11 wherein said controller comprises a digital processing circuit for generating at least one control signal for said at least one variable-gain component.

17. The automatic gain control system of claim 16 wherein said digital processing circuit comprises:
an analog-to-digital (A/D) converter for converting an output from said sensor to a digital value;
a digital control loop connected to said A/D converter; and
an output section for generating at least one control signal for said at least one variable-gain component based upon said digital control loop.

18. The automatic gain control system of claim 17 wherein said at least one variable-gain component comprises:
at least one first variable-gain component having an increasing gain for an increasing control signal; and
at least one second variable-gain component connected in series with said at least one first variable-gain component and having a decreasing gain for an increasing control signal.

19. The automatic gain control system of claim 17 wherein said output section comprises a digital-to-analog converter.

20. A method for controlling a signal gain comprising:
sensing an amplitude of a signal from at least one variable-gain component having a controllable gain over a gain control range; and
controlling the gain of the at least one variable-gain component responsive to the sensed amplitude and according to coarse and fine gain values to set the amplitude within an operating window smaller than the gain control range of the at least one variable-gain component by
implementing at least one coarse gain jump from a current coarse gain value to a new coarse gain value when the amplitude is outside the operating window, and
implementing movement to a fine gain value when the amplitude is in the operating window.

21. The method of claim 20 wherein controlling comprises setting coarse and fine gain values to substantially center the signal from the at least one variable-gain control component within the operating window.

22. The method of claim 20 wherein a size of the at least one coarse gain jump from the current coarse gain value to the new coarse gain value is based upon the prior coarse gain value.

23. The method of claim 22 wherein each coarse gain jump is half-way between the current coarse gain value and either a previous lower coarse gain value or a lowest coarse gain value when the amplitude is at or below a low end of the operating window; and wherein each coarse gain jump is half-way between the current coarse gain value and either a previous higher coarse gain value or a highest coarse gain value when the sensor indicates the signal is at or above a high end of the operating window.

24. The method of claim 22 wherein a direction for each jump is downward when the sensor indicates the signal is at a lower end of the gain control range, and upward when the sensor indicates the signal is at a higher end of the gain control range.

25. The method of claim 20 wherein a range of fine gain values extends at least over a range of spacing between adjacent coarse gain values.

* * * * *